(12) United States Patent
Hastings

(10) Patent No.: US 11,719,728 B2
(45) Date of Patent: Aug. 8, 2023

(54) APPARATUS AND SYSTEM FOR WIDE-RANGE CURRENT SENSING

(71) Applicant: Texas Instruments Incorporated, Dallas, TX (US)

(72) Inventor: Roy Alan Hastings, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/935,260

(22) Filed: Sep. 26, 2022

(65) Prior Publication Data

US 2023/0019385 A1 Jan. 19, 2023

Related U.S. Application Data

(62) Division of application No. 17/077,404, filed on Oct. 22, 2020, now Pat. No. 11,486,909, which is a division of application No. 16/135,625, filed on Sep. 19, 2018, now Pat. No. 10,845,396.

(51) Int. Cl.
*G01R 19/00* (2006.01)
*H01L 27/02* (2006.01)

(52) U.S. Cl.
CPC ...... *G01R 19/0092* (2013.01); *H01L 27/0207* (2013.01)

(58) Field of Classification Search
CPC .. G01R 19/0092; G01R 15/08; H01L 27/0207
See application file for complete search history.

(56) References Cited

U.S. PATENT DOCUMENTS

| | | | |
|---|---|---|---|
| 5,646,520 A | 7/1997 | Frank | |
| 6,462,527 B1 | 10/2002 | Maneatis | |
| 9,360,879 B2 * | 6/2016 | Levhar | G05F 3/02 |
| 9,791,480 B2 * | 10/2017 | Qin | G01R 19/0092 |
| 9,983,239 B2 * | 5/2018 | Mayell | H01L 27/0623 |
| 10,234,487 B2 * | 3/2019 | Nizza | G01R 19/0092 |
| 2004/0227539 A1 * | 11/2004 | Thiery | G01R 19/0092 |
| | | | 324/762.09 |
| 2011/0101943 A1 * | 5/2011 | Kato | G01R 19/0092 |
| | | | 323/282 |
| 2013/0342273 A1 | 12/2013 | Petrie | |
| 2014/0234990 A1 | 8/2014 | Feng | |
| 2015/0137820 A1 | 5/2015 | Mikuteit | |
| 2020/0014345 A1 | 1/2020 | Effing | |

* cited by examiner

*Primary Examiner* — Akm Zakaria
(74) *Attorney, Agent, or Firm* — Ray A. King; Frank D. Cimino

(57) ABSTRACT

A sectioned field effect transistor ("FET") for implementing a rapidly changing sense range ratio dynamically in response to changing load and main supply conditions. The sectioned FET may have multiple main FET sections, and multiple sense FET sections. These sections can be dynamically connected and disconnected from the sectioned FET. The sections may also be connected by a common gate. There may also be common drain or source connections for the main FET sections, and also common drain or source connections for the sense FET sections. The sectioned FET allows for the sense range to be extended by a multiple of k+1, where k is the size ratio or factor of the additional sense FET sections. This allows the current sense range ratio to be extended to (m+n)/n*(k+1).

15 Claims, 6 Drawing Sheets

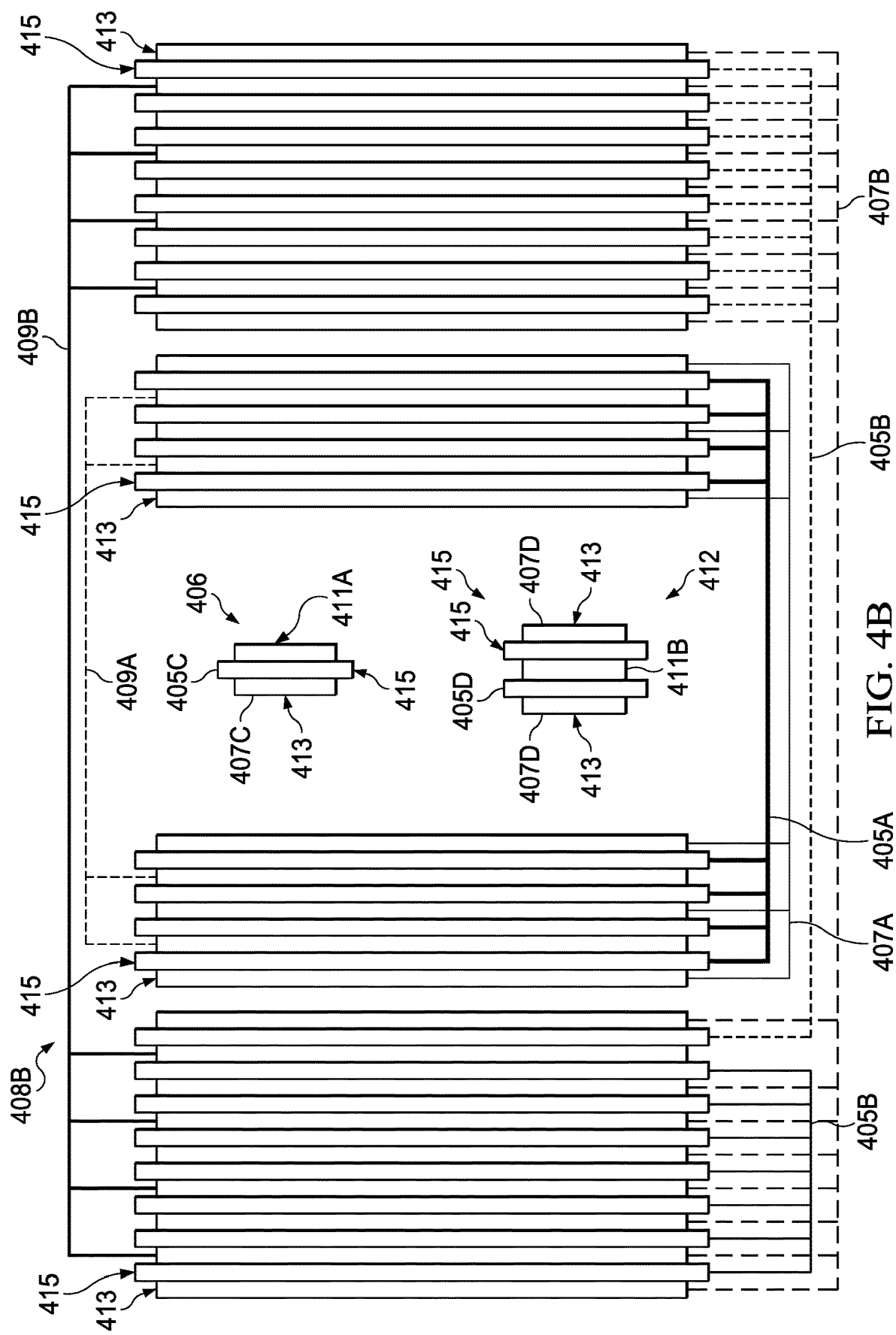

APPARATUS AND SYSTEM FOR WIDE-RANGE CURRENT SENSING

This application is a divisional of prior U.S. patent application Ser. No. 17/077,404, filed Oct. 22, 2020, which is a divisional of prior U.S. patent application Ser. No. 16/135,625, filed Sep. 19, 2018, now U.S. patent Ser. No. 10/845,396, each of which are incorporated by reference in their entireties.

BACKGROUND

Power over Ethernet ("PoE") standards, such as IEEE 802.3af, IEEE 802.3at, and IEEE 802.3bt, define a means of transmitting DC power over Ethernet cables. These standards, which are herein incorporated by reference, define Power Source Equipment ("PSE") which injects power into Ethernet cables, and powered devices ("PDs") which draw power from the cables. For example, a voice of internet protocol phone is powered when plugged into an Ethernet port.

As part of the mandated PoE functionality, a PSE must monitor when powered devices are disconnected from the cables. The PoE standards define two methods by which a PSE can sense disconnection of a powered device. One of these, called DC disconnect, deems the powered device to have been disconnected if the DC current drawn by the cable drops below a threshold which lies between 5 and 10 mA. The PSE also implements current limiting to protect the cabling and prevent overload of its power source. This current limit may be as high as 1.4-1.6 A for four-pair applications under IEEE 802.3bt. The PSE therefore can accurately sense a wide range of currents.

SUMMARY

The present disclosure provides an apparatus and system for wide-range current sensing wherein the both a main FET and a sense FET are sectioned. In low current situations, a small section of the main FET is used along with all of the Sense FET. In high current limiting situations, all of the main FET and a small portion of the sense FET are used. The main FET can also be referred to as a power FET. This disclosure can be particularly advantageous in PoE/PSE systems, which must accurately sense a wide range of currents. However, many other applications can also benefit from this present disclosure.

One example of the present disclosure can dynamically add a section to the main FET. Similarly, a section may be dynamically removed from the main FET when no longer needed.

Another example of the present disclosure can dynamically add a section to the sense FET. Similarly, a section may be dynamically removed from the sense FET when no longer required.

In yet another example of the present disclosure, sections can be dynamically added to, or removed from, both the main FET and the sense FET.

BRIEF DESCRIPTION OF THE DRAWINGS

The novel features believed characteristic of the disclosed principles are set forth in the appended claims. The disclosed principles, however, as well as a preferred mode of use, further objectives and advantages thereof, will be best understood by reference to the following detailed description of illustrative embodiments when read in conjunction with the accompanying drawings, wherein:

FIG. 4B is a layout representation of a sectioned main FET and a sectioned sense FET.

DETAILED DESCRIPTION

Figure 1:
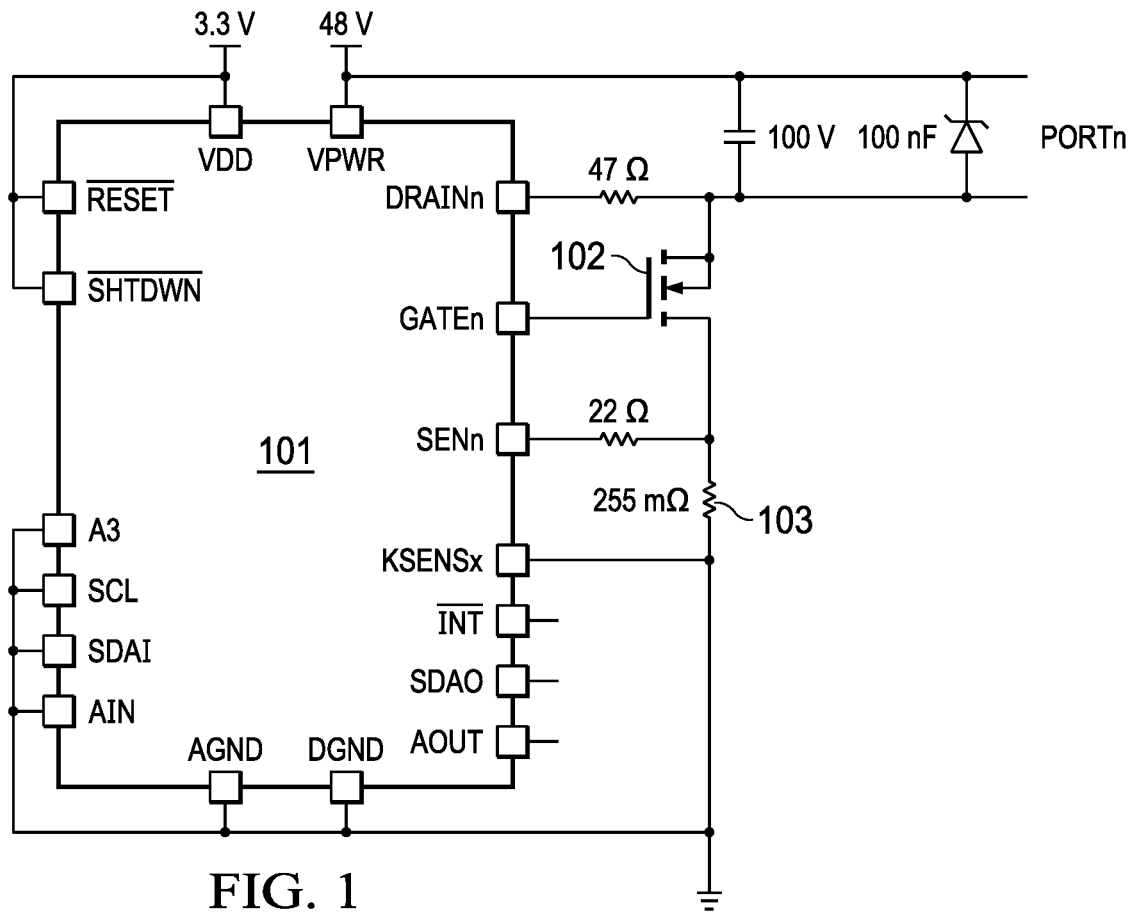
FIG. 1 is an illustration of a PoE/PSE system employing an external resistor.

FIG. 1 is an illustration of a Power-Over-Ethernet Power Sourcing Equipment (PoE/PSE) system. A controller 101 is coupled to a main FET 102 and an external sense resistor 103. The controller 101 can drive multiple ports, each having a corresponding main FET 102, and external sense resistor 103. The external sense resistor 103 costs money, consumes board space, and dissipates power. Integrating this sensing capability within the controller would provide a smaller, cheaper, and lower-power solution. This becomes especially attractive in cases where the main FET 102 can also be integrated internally. However, whatever solution is chosen should be capable of sensing a wide range of currents to implement both DC disconnect and current limiting. Furthermore, the circuit should be able to support sudden increases of load current from just above the DC disconnect threshold (5-10 mA) to just below current limiting (1.5 A) without generating excessive voltage drops that might interfere with proper operation of the PD.

Figure 2A:
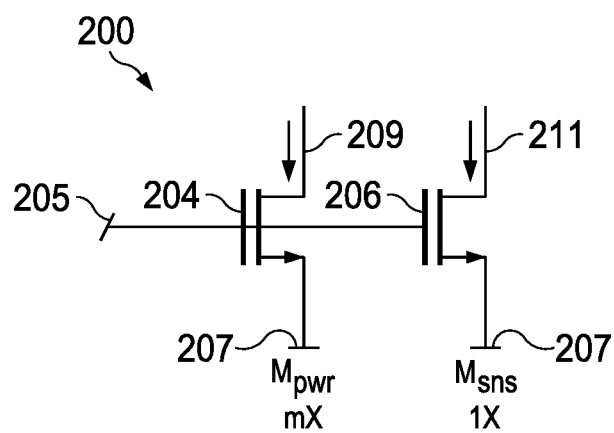
FIG. 2A is a schematic representation of a main FET and an associated sense FET.

FIG. 2A illustrates a current sensing circuit 200 utilizing a main FET 204 and an associated sense FET 206. The current sense circuit 200 can have a common gate 205 of the main FET 204 and the sense FET 206, and a common source 207 of the main FET 204 and the sense FET 206. In at least one version, the common source 207 is coupled to ground. The main FET 204 has a main FET drain 209, and the sense FET 206 has a sense FET drain 211. If the drain voltages of the two FETs are held equal, then the currents flowing through the two transistors will be proportional to the ratio of their device sizes, where the size of a FET is understood to equal the number of fingers it contains times the width of each finger, divided by the length of each finger. The current flowing through the main FET 204 will therefore generate a proportional current through sense FET 206. To reduce the current through the sense FET 206, large ratios of main FET 204 to sense FET 206 size are needed, such as, 10,000:1. Although N-channel metal-oxide-semiconductor field-effect transistors (MOSFETs) are illustrated, other types of transistors can be employed, for example, P-channel MOSFETs, NPN bipolar transistors, or PNP bipolar transistors.

Application of a suitable voltage to the common gate 205 turns on the main FET 204 and the sense FET 206. Additional circuitry (not shown) biases the drain-to-source voltage of sense FET 206 to equal the drain-to-source voltage of main FET 204. The main FET 204 and the sense FET 206 may share similar physical and electrical characteristics, with the exception that the size of the main FET 204 is m times larger than the size of the sense FET 206. If the main FET 204 has Np fingers each of width Wp and length Lp, and the sense FET 206 has Ns fingers each of width Ws and length Ls, then m=(Np/Ns)*(Wp/Ws)*(Ls/Lp). The ratio of main FET size to sense FET size m is usually a large number, for example, 10,000, to limit the current flowing through the sense FET because this current is usually dissipated within the control circuit (not shown) and therefore represents an undesirable power loss. If the ratio m is made too small, the power loss will become undesirably large; if it is made too large, then the sense FET current may become unmanageably small when the main FET currents are relatively low. If this ratio (10,000:1) is used to implement a 1.5 A current limit, the current delivered by the sense FET 206 will equal 1.5 A/10000=150 µA. For the same ratio, a DC disconnect threshold will involve a sense FET current of 7.5 mA/10000=0.75 µA (200:1 operating range).

In normal operation, the gate-to-source voltage is made as large as possible to drive the FETs deep into the linear region and reduce voltage drops. The PSE may then monitor the current drawn by the PD to determine whether it is still connected. This feature, which is called DC disconnect, requires sensing small currents flowing through FETs operating in the linear region. On the other hand, if the current drawn by the PD becomes excessively large, then the gate-to-source voltage of FETs 204 and 206 is throttled back, forcing these FETs into saturation and limiting the current flow. This feature requires sensing large currents flowing through FETs operating in saturation.

Figure 2B:
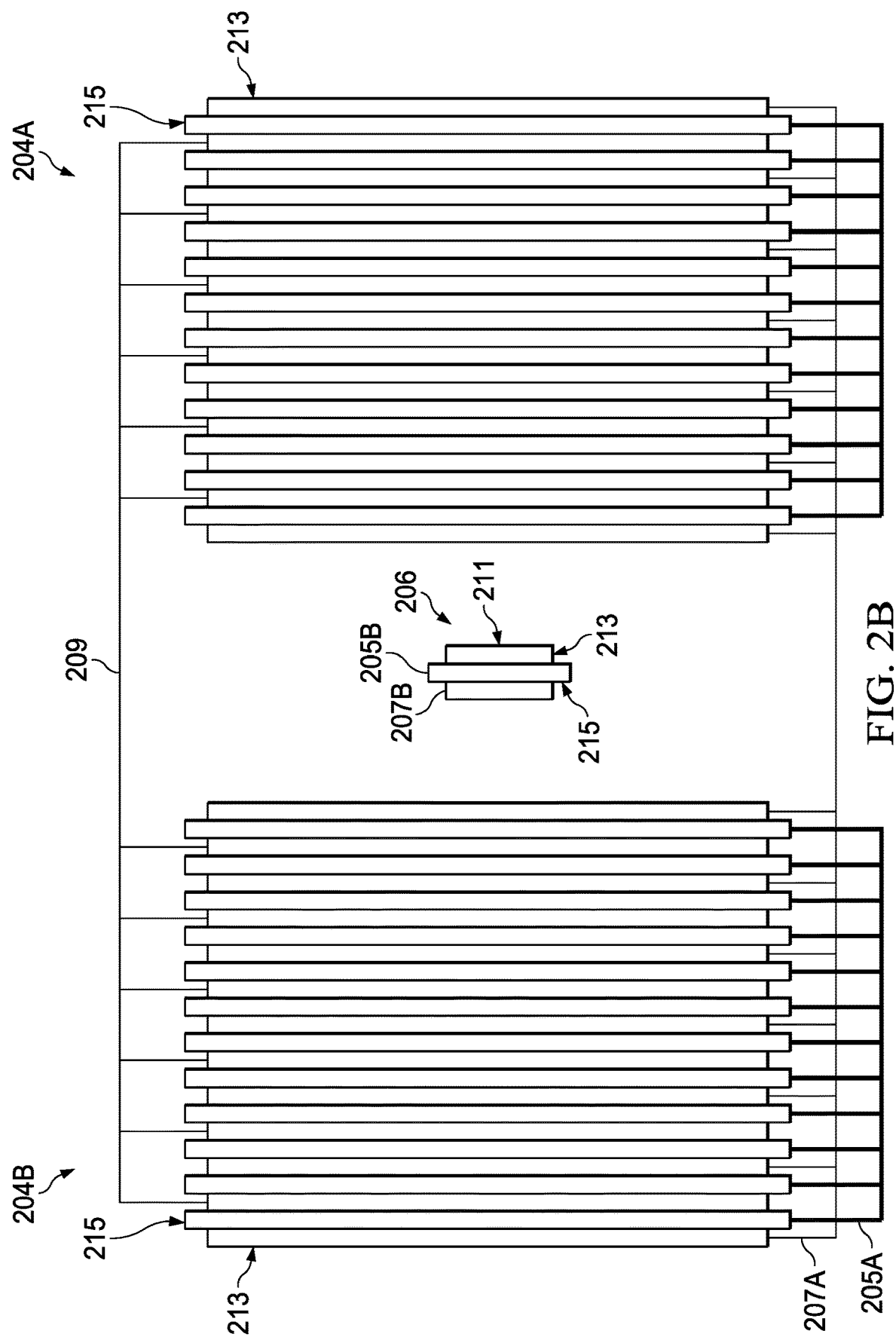
FIG. 2B is a layout representation of a main FET and an associated sense FET.

FIG. 2B is a layout representation of a main FET 204 that may include a first main FET section 204A, and a second main FET section 204B, and an associated sense FET 206. The main FET 204 and the sense FET 206 include source/drain termination(s) 213, and gate poly(s) 215. A substrate (not illustrated) is protected from a diffusion or implant process utilized to create the source/drain termination(s) 213 by a layer of polysilicon. The layer of polysilicon can be the gate polysilicon layer or gate poly(s) 215. In at least one example, the gate poly(s) 215 of the main FET 204, are coupled together forming a common gate 205A, additionally the gate poly(s) 215 of the sense FET 206 can also be coupled together forming a common gate 205B. In at least one version, the common gate 205A, and the common gate 205B are coupled together. The source/drain termination(s) 213 of the main FET 204 can be interconnected to create a common source 207A, and a common main FET drain 209. In at least one example, the source/drain termination(s) 213 of the sense FET 206 are a common source 207B, and a sense FET drain 211. In at least one example, the common source 207A, and the common source 207B are coupled together.

Figure 3:
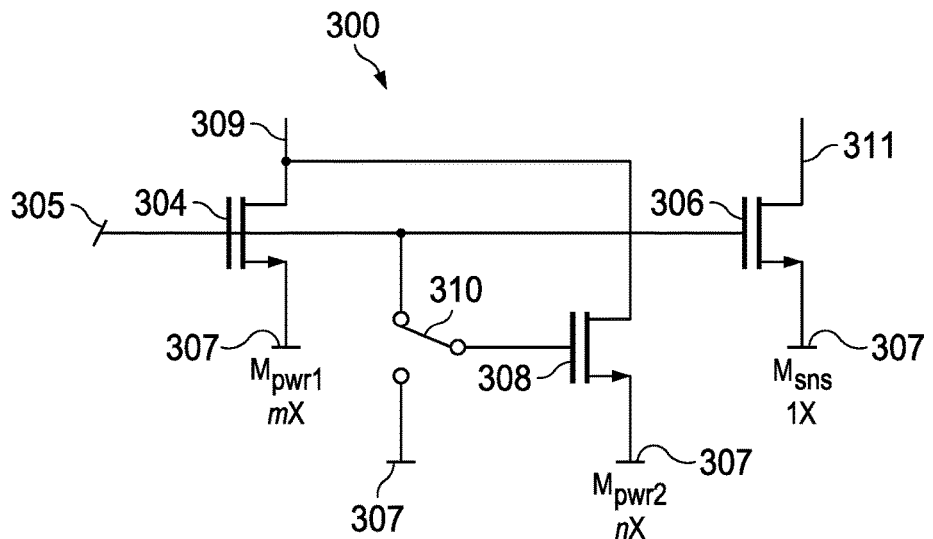
FIG. 3 is a schematic representation of a sectioned main FET and an associated sense FET.

FIG. 3 is an illustration of a current sensing circuit 300 that includes a main FET (or a main transistor) having a first transistor section 304, and a second transistor section 308. In at least one version, the first transistor section 304 and the second transistor section 308 are formed from matched FET sections from the same substrate. The sections may be connected in parallel, series, or a combination thereof, to form a first set of main FET section 304, and/or a second set of main FET section 308. The sense circuit 300 also includes a sense FET 306. The first main FET 304 may be used in conjunction with the sense FET 306 for sensing small currents flowing through common main FET drain 309, such as may occur during DC disconnect sensing. Both the first main FET 304 and the second main FET 308 in conjunction with the sense FET 306 can be employed for sensing large currents flowing through the common main FET drain 309, such as may occur during current limiting.

The first main FET 304 and the sense FET 306 are always connected to common gate 305, while the gate of the second main FET 308 may be selectively switched to common gate 305 (enabling the second main FET) or to common source 307 (disabling the second main FET) through a sense switch 310. The first main FET 304, and the second main FET 308 may have a common main FET drain 309 and a common source 307 (shown here connected to ground). The sense FET 306 has a drain 311 (or sense FET drain 311) that is separated from the common main FET drain 309, but the sense FET 306 shares a common gate 305 and a common source 307 with the main FETs 304 and 308.

The current sense circuit 300 senses how much current flows through common main FET drain 309 and generates a smaller ratio current that flows through sense FET drain 311. When the current through sense FET drain 311 rises above a certain threshold (that is set based on efficiency and voltage drop considerations) then additional main FETs or main FET sections can be added. This can be implemented using a comparator (not shown) that triggers when current through sense FET drain 311 exceeds a predetermined threshold level. The output of this comparator then controls switch 310. While two main FETs are illustrated, additional main FETs can also be included. Each of the additional main FETs can have their own threshold to selectively couple or decouple them from the current sense circuit 300. For example, as the current goes up, the main FETs can be added to maintain a desired voltage drop across the main FETs to prevent excessive heating and efficiency loss. In other examples, an amplifier, sensor, or other measurement device may be used in place of a comparator for monitoring current flow through sense FET drain 311, and generate the controlled signal for the sense switch 310. The ratio of the current through the sense FET drain 311 to the current through the common main FET drain 309 depends upon the sizes of the main and sense FETs. For example, a first main FET 304 can be m times greater than the size of the sense FET 306, and the second main FET 308 can be n times greater than the size of the sense FET 306. Suppose sense FET 306 consists of Ns fingers of width Ws and length Ls. Fingers may refer to multiple sections of a FET each of which have the same width and length that can be connected in parallel. Accordingly, the size of a fingered FET transistor may equal N*(W/L). If the first main FET 304 consists of Np1 fingers of width Wp1 and length Lp1, then the ratio of the first main FET 304's size to the sense FET 306's size can be m=(Np1/Ns)*(Wp1/Ws)*(Ls/Lp1). Similarly, if second main FET 308 consists of Np2 fingers of width Wp2 and length Lp2, then the ratio of second main FET 308's size to the sense FET 311's size can be n=(Np2/Ns)*(Wp2/Ws)*(Ls/Lp2).

If the sense switch 310 connects the gate of second main FET 308 to the common gate 305, then the second main FET 308 is coupled in parallel with the first main FET 304. Additional circuitry (not shown) can ensure that the voltage on the sense FET drain 311 equals the voltage on the common main FET drain 309, and accordingly the current passing through the sense FET drain 311 may equal approximately 1/(m+n) times the drain current passing through the common main FET drain 309.

If the sense switch 310 connects the gate of second main FET 308 to the common source 307, then the first main FET 304 conducts all of the current flowing through common main FET drain 309. Additional circuitry (not shown) can ensure that the voltage on the sense FET drain 311 equals the voltage on the common main FET drain 309, and accordingly the current passing through the sense FET drain 311 may equal approximately 1/m times the drain current passing through the common main FET drain 309.

Therefore, the sense switch 310 can be used to select the main FET:sense FET ratio of current sense circuit 300 to equal either m, or m*n. For example, if the sense switch 310 is set to select the smaller ratio, then the current through the sense FET drain 311 is increased relative to the current that would flow if the larger ratio were selected. Selecting the smaller ratio may prove an advantage when attempting to sense small currents flowing through the common main FET drain 309, as the current flowing through the sense FET drain 311 may be larger and thus less likely to suffer inaccuracies due to noise and leakage. For example, the smaller ratio may therefore prove advantageous when using the current sense circuit 300 for sensing DC disconnect in a PSE application. Selecting the larger ratio may prove advantageous when attempting to sense large currents flowing through the common main FET drain 309, as the current flowing through the sense FET drain 311 is thereby decreased and thus represents less power loss. For example, the larger ratio may therefore prove advantageous when using the current sense circuit 300 for implementing current limiting in a PSE application.

Current sense circuit 300 can be extended by incorporating an additional second main FETs, each with a corresponding sense switch. Current sense circuit 300 provides a technical advantage for circuits that do not have rapidly varying load currents. Suppose that current sense circuit 300 may be currently configured for sensing a small load current flowing through the common main FET drain 309. The sense switch 310 connects the gate of the second main FET 308 to ground, leaving only the first main FET 304 to conduct the current and increasing the current flowing through the sense FET drain 311. However, now suppose that the load current suddenly increases to a value just less than the current limit. All of this current flows through the first main FET 304, generating a drain-to-source voltage drop that can be substantially larger than that which would exist if the second main FET 308 were also able to conduct current. This larger drain-to-source voltage drop may exceed the allowed voltage drop required by specifications. The circuitry (not illustrated) controlling the sense switch 310 therefore reconnects the gate of the second main FET 308 to the common gate 305. Because the circuitry connected to common gate 305 may have limited current drive capability, significant time may elapse before both the first main FET 304 and the second main FET 308 reach their minimum on resistances.

Figure 4A:
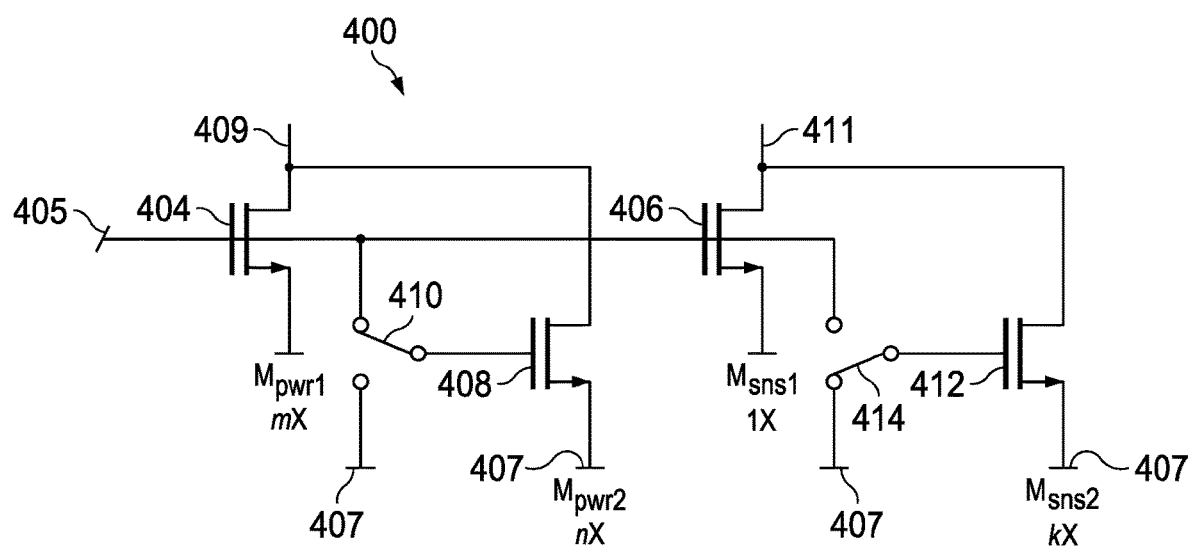
FIG. 4A is an illustration of a sectioned main FET and sectioned sense FET solution.

FIG. 4A is an illustration of a dual stage current sense circuit 400. The dual-stage current sense circuit 400 may have a first main FET 404 (or a first power transistor 404), a second main FET 408 (or a second power transistor 408), a first sense FET 406 (or a first sense transistor 406), and a second sense FET 412 (or a second sense transistor 412). The main FET and sense FET can both have additional FETs. In at least one version, the main FETs 404/408 and/or the sense FET 406/412 are formed by a set of FET section(s). The sections may be connected in parallel, series, or a combination thereof, to form a first set of main FET sections 404, a second set of main FET sections 408, a first set of sense FET sections 406, and/or a second set of sense FET sections 412.

The gate of the second main FET 408 may be selectively switched from the common gate 405 or the common source 407 through a first sense switch 410. The gate of the second sense FET 412 may be switched from the common gate 405 or the common source 407 through a second sense switch 414. If first main FET 404 has Np1 fingers of width Wp1 and length Lp1, and the first sense FET 406 has Ns1 fingers of width Ws1 and length Ls1, then the ratio of the size of the first main FET 404 to the size of the first sense FET 406 m=(Np1/Ns1)*(Wp1/Ws1)*(Ls1/Lp1). If second main FET 408 has Np2 fingers of width Wp2 and length Lp2, then the ratio of the size of the second main FET 408 to the size of the first sense FET 406 n=(Np2/Ns1)*(Wp2/Ws1)*(Ls1/Lp2). If the second sense FET 412 has Ns2 fingers of width Ws2 and length Ls2, then the ratio of the size of the second sense FET 412 to the size of the first sense FET 406 equals k=(Ns2/Ns1)*(Ws2/Ws1)*(Ls1/Ls2).

When the first main FET 404, second main FET 408, and first sense FET 406 are active, but the second sense FET 412 is not active, the ratio (or main ratio) between the current through the common main drain 409 and the current through the common sense drain 411 may equal approximately (m+n):1. When the first main FET 404, first sense FET 406, and the second sense FET 412 are active, but the second main FET 408 may not be active, the ratio (or sense ratio) between the current through the common main drain 409 and the current through the common sense drain 411 may equal approximately m:(k+1). The first of these ratios, (m+n):1, can be much larger than the second of these ratios, m:(k+1). Specifically, it can be approximately (m+n)/m*(k+1) times larger. If we call this quantity the range of current sense ratios, then dual stage current sense circuit 400 can achieve a range of current sense ratios of (m+n)/m*(k+1). By comparison, current sense circuit 300 can achieve a range of current sense ratios of (m+n)/m. Sectioning or adding additional transistors for both the main FETs and the sense FETs, as may be done in dual-stage current sense circuit 400, allows for increases of the current sense ratios range by a factor of (k+1). Dual stage current sense circuit 400 may therefore achieve a high range of current sense ratios without using a large ratio of m:n.

The first main FET 404, and the second main FET 408 may have a common main drain 409, and a common source 407 (illustrated connected to ground). Similarly, the first sense FET 406, and the second sense FET 412 may have a common sense drain 411, and a common source 407. In other versions, the common source 407 may also be split into a common main source, and a common sense source. The gate to source voltage of the main FET and the sense FET, in at least one version, closely track each other when the main and sense FET are in linear mode.

In at least one version, the common gate 405 is coupled to the gate of the first main FET 404, the gate of the first sense FET 406 and selectively coupled to the gate of the second main FET 408 through a first sense switch 410 and the gate of the second sense FET 412 through a second sense switch 414. The gate of the second main FET section 408 may be switched from the common gate 405 or the common source 407 through a first sense switch 410 that may be controlled by a comparator that senses when the current through common sense drain 411 exceeds a predetermined threshold level. In at least one example, the first sense switch 410 may couple the gate of the second main FET 408 to the common source 407 when the current drops below the threshold value, but when the current exceeds the threshold value, the first sense switch 410 may couple the gate of the second main FET 408 to the common gate 405, which is coupled to the gate of the first main FET 404 as well.

The gate of the second sense FET 412 may be selectively switched from the common gate 405 or the common source 407 through a second sense switch 414 that may be controlled by a comparator (not shown) that senses when the current through common sense drain 411 exceeds a predetermined threshold level. In at least one example, the second sense switch 414 may couple the gate of the second sense FET 412 to the common source 407 when the current exceeds the threshold value, but when the current drops below the threshold value, the second sense switch 414 may couple the gate of the second sense FET 412 to the common gate 405, which is coupled to the gate of the first sense FET 406 as well.

The first and second main FETs 404/408 can have common sources, drain, and gate connections, and the first and second sense FETs 406/412 can have common sources, drain, and gate connections. In at least one version, the gate connections of the main and sense FETs can be coupled together, and the source connections of the main and sense FETs may be coupled together. For example, the first and second main FETs 404/408, and the first and second sense FETs 406/412 can have a common gate connection. While the drains of the first and second main FETs may have a common drain, the first and second sense FETs can have a common sense drain separate from the common main drain of the main FETs. The sources or grounds for the first and second main FETs, and the first and second sense FETs may be common, or separate. The FET's could also be PNP or NPN transistors, and accordingly the drains would become collectors, the gates would become bases, and the sources would become emitters.

FIG. 4B is a layout representation of a sectioned main FET and an associated sectioned sense FET. The main FET includes a first main FET 404, (having a first half 404A, and a second half 404B) and a second main FET 408, (having a first half 408A, and a second half 408B). The sense FET includes a first sense FET 406, and a second sense FET 412. The first main FET 404, the second main FET 408, the first sense FET 406, and a second sense FET 412 include source/drain termination(s) 413, and gate poly(s) 415.

In at least one example, the source/drain termination(s) 413 of the first main FET 404 can be coupled to a common main FET drain 409A, and a common source 407A respectively. The source/drain termination(s) 413 of the second main FET 408 can be coupled to a common main FET drain 409B, and a common source 407B respectively. In at least one example, the source/drain termination(s) 413 of the first sense FET 406 can be coupled to a common sense drain 411A, and a common source 407C. The source/drain termination(s) 413 of the second sense FET 412 can be coupled to a common sense drain 411B, and a common source 407D. In at least one version, the common drain(s) 409A, and 409B are coupled together, and the common drain(s) 411A and 411B are coupled together.

In at least one implementation, the gate poly(s) 415 of the first main FET 404 can be coupled together to create a common gate 405A and the gate poly(s) 415 of the second main FET 408 can be coupled together to create a common gate 405B. In at least one example, the gate poly(s) 415 of the first sense FET 406 can be coupled together to create a common gate 405C and the gate poly(s) 415 of the second sense FET 412 can be coupled together to create a common gate 405D. In at least one version, the common gate(s) 405A, 405B, 405C, and 405D are selectively coupled together. In other versions, the common gates 405A and 405C are coupled together and common gates 405B and 405D are selectively coupled with common gates 405A/405C.

Figure 5:
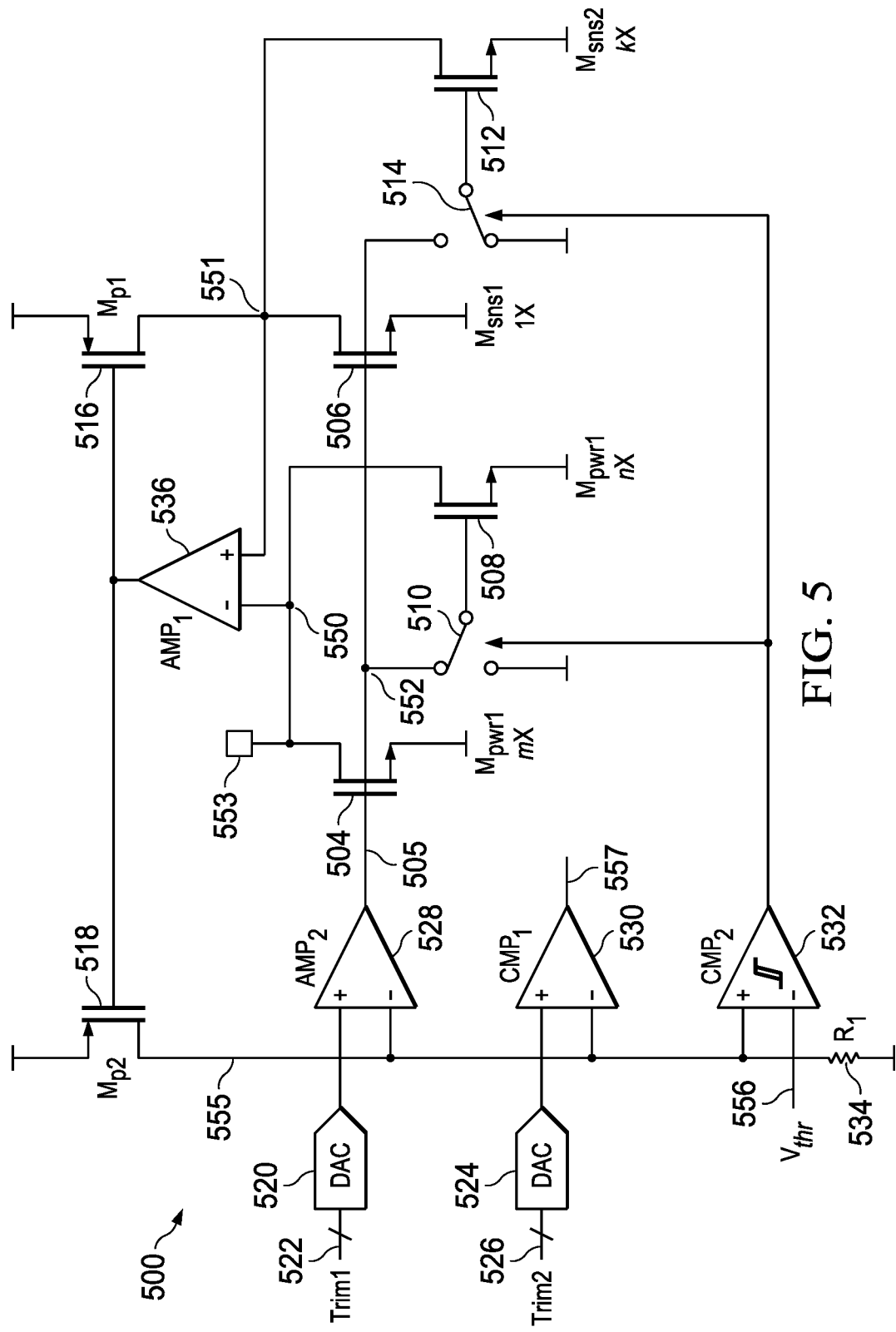
FIG. 5 illustrates a complete sectioned main FET and sectioned sense FET system solution.

FIG. 5 is an illustration of a PoE control system utilizing a dual stage current sense system 500. The current sense system 500 may have a sectioned main transistor including a first main FET section 504 and a second main FET section 508, and a sectioned sense transistor including a first sense FET section 506 and a second sense FET section 512. In at least one example, the main FET sections 504/508 may be individual matched transistors formed on a single substrate, similarly the sense FET sections 506/512 may be individual matched transistors formed on a single substrate. The gate of the second main FET section 508 may be selectively switched from the common gate 505 or the common source 507 through a first sense switch 510. The gate of the second sense FET section 512 may be selectively switched from the common gate 505 or the common source 507 through a second sense switch 514. Additional main or sense sections can be utilized.

The drains of the first main FET section 504 and the second main FET section 508 can be coupled to node 550 (or main FET drain node 550). The drains of the first sense FET section 506 and the second sense FET section 512 may be coupled to node 551 (or sense FET drain node 551). The inverting input or first input of amplifier 536 (may also be referenced as the control amplifier 536) may connect to node 550, and the noninverting input or second input of amplifier 536 may connect to node 551.

The output of amplifier 536 (or control amplifier output) connects to the gate of P-channel FET transistor 516 (or first transconductor transistor 516). In some versions, the source of P-channel FET transistor 516 can connect to a power supply (not shown) or others circuitry (not shown). The drain of P-channel FET transistor 516 can connect to node 551. Amplifier 536 adjusts the voltage on the gate of P-channel FET transistor 516 to drive the voltage on node 551 to approximately equal the voltage on node 550.

If the first sense switch 510 connects the gate of the second main FET section 508 to node 552 (or common gate node 552), and the second sense switch 514 connects the gate of the second sense FET section 512 to the common source 507, after the amplifier 536 has driven the voltage on node 551 to approximately equal the voltage on node 550, the ratio of the drain current through the P-channel FET transistor 516 to the current through terminal 553 may equal approximately 1:(m+n). The terminal 553 connects to external circuitry (not shown) that source current into the terminal. If the first sense switch 510 connects the gate of the second main FET section 508 to the common source 507, and the second sense switch 514 connects the gate of the second sense FET section 512 to node 552, after the amplifier 536 has driven the voltage on node 551 to approximately equal the voltage on node 550, the ratio of the drain current through the P-channel FET transistor 516 to the current through terminal 553 may equal approximately (k+1):m.

The gate of a second P-channel FET 518 (or second transconductor transistor 518) may be coupled to the output of the amplifier 536. In at least one version, the P-channel FETs 516/518 convert the voltage output of the amplifier 536 into currents that are injected into nodes 551/555. The source of second P-channel FET 518 may be coupled to the source of P-channel FET transistor 516. Assuming that the sizes of the P-channel FET transistors 516 and 518 are equal, then the current through the drain of the P-channel FET transistor 518 can equal the current through the drain of P-channel FET transistor 516. This current passes through resistor 534 to ground, developing a voltage on node 555 that may be proportional to the current flowing through terminal 553. The voltage on node 555 may be utilized to sense the current through terminal 553.

A first digital to analog converter (DAC) 520 and the amplifier 528 (or transistor gate amplifier 528) act together to limit the maximum current that can flow through the terminal 553. Digital to analog converter 520 can receive a trim code 522 and may generate a voltage that can be applied to the noninverting input (a first transistor gate amplifier input) of amplifier 528. In at least one example, the voltage generated by digital to analog converter 520 may represent the desired current limit. The voltage on proportional voltage node 555, which represents the actual current flowing through terminal 553, may be applied to the inverting input (second transistor gate amplifier input) of amplifier 528. If the voltage on proportional voltage node 555 exceeds the voltage generated by the digital to analog converter 520, then the current through terminal 553 has exceeded the desired current limit.

Amplifier 528 reduces its output voltage, which can in turn be applied to common gate 505 and the connected node 552. As this voltage diminishes, the drain current through the first main FET section 504 and the first sense FET section 506 diminish. If the gate of the second main FET section 508 is coupled to node 552 through the first sense switch 510, then its drain current may also diminish. Similarly, if the gate of the second sense FET section 512 is coupled to node 552 through the second sense switch 514, then its drain current may also diminish. This action simultaneously reduces the current through terminal 553 and the drain current through P-channel FET transistor 516. Therefore, amplifier 528 may reduce the voltage on the proportional voltage node 555 until it equals the voltage output by digital to analog converter 520. Under this condition, the current through terminal 553 can be limited to the desired current limit.

Digital to analog converter 524 and comparator 530 can implement a DC disconnect function. Digital to analog converter 524 receives trim code 526 and generates a voltage representing a DC disconnect threshold. This voltage may be applied to the noninverting input of comparator 530. The inverting input of comparator 530 connects to node 555 (or proportional voltage node 555). When the voltage on node 555 drops below the voltage generated by digital to analog converter 524, the output 557 (or disconnect comparator output 557) of comparator 530 goes low, signifying that the current flowing through terminal 553 has fallen below the DC disconnect threshold specified by trim code 526. The output 557 can be used to inform the PSE control logic (not illustrated) that the powered device is no longer connected. The PSE control logic can then take whatever action is appropriate.

Comparator 532 (or switching comparator 532) can determine the settings of sense switches 510 and 514 in response to a threshold voltage 556 that can be set internally. In other versions, the threshold voltage 556 may be set by an external signal. The threshold voltage 556 is coupled to the inverting input of comparator 532. Proportional voltage node 555 is coupled to the noninverting input of comparator 532.

If the voltage on the proportional voltage node 555, which represents the current passing through terminal 553, is less than the threshold voltage 556, then the output or control signal of comparator 532 goes low. When the output or control signal of comparator 532 goes low, current flowing through terminal 553 can be relatively small. Under these conditions, the ratio of main FET current to sense FET current should be reduced, or more sense FET sections should be coupled to the common gate 505 and main FET sections removed from the common gate 505. Therefore, when the output of comparator 532 goes low, the first sense switch 510 connects the gate of the second main FET section 508 to ground, and the second sense switch 514 connects the gate of the second sense FET section 512 to node 552.

If the voltage on the proportional voltage node 555 is greater than the threshold voltage 556, then the output of comparator 532 goes high. This indicates that the current flowing through terminal 553 may be relatively large. Under these conditions, the ratio of main FET current to sense FET current should be increased, or more main FET sections should be added, and sense FET sections should be removed. When the output of the comparator 532 goes high, the first sense switch 510 connects the gate of the second main FET section 508 to node 552, and second sense switch 514 connects the gate of the second sense FET section 512 to ground. Comparator 532 may optionally incorporate hysteresis to help suppress noise when the voltage on the proportional voltage node 555 approaches the threshold voltage 556.

As described above, system 500 implements a DC disconnect threshold current $I_{DCD}=V_{DCD}/R_1*m/(1+k)$, where $V_{DCD}$ may be the voltage generated by the digital to analog converter 524, and $R_1$ can be the resistance of the resistor 534. System 500 also may implement a current limit $IC_L=V_{CL}/R_1*(m+n)$, where $V_{CL}$ can be the voltage generated by the digital to analog converter 520. The values of m, n, and k may vary slightly due to process variations or mismatches, and the trim codes 522 and 526 may be adjusted to compensate and/or obtain the desired values of $I_{DCD}$ and $I_{CL}$. Thanks to the wide range of current sense ratios system 500, a relatively high current limit (for example, 1.5 A) can be set along with a relatively low DC disconnect threshold (for example, 7.5 mA) without using a large ratio m:n. These wide ranges of current sense ratios in turn ensure that the on-resistance observed at terminal 553 may never be so large as to violate specifications, even when the circuit may be configured for sensing the DC disconnect threshold. Simultaneously selectively switching in and out sections of both the main and sense FETs can obtain this advantage, rather than just selectively switching in and out sections of one of these main or sense FETs.

Figure 6:
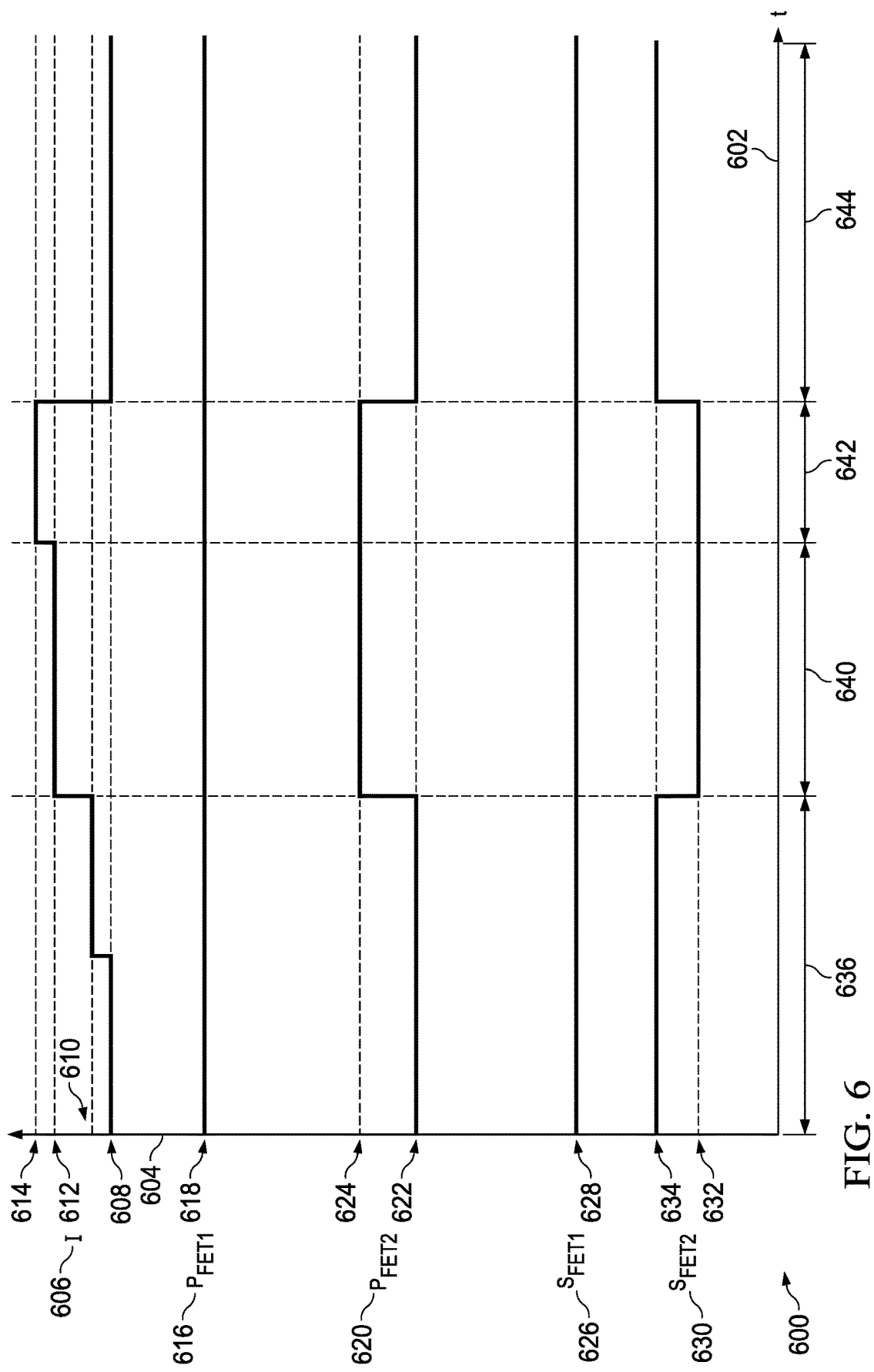
FIG. 6 is a sectioned main FET and sense FET timing diagram

FIG. 6 illustrates a sectioned main and sense FET timing diagram 600. The timing diagram 600 illustrates the various gate signals for main and sense FET sections as a function of the current on the vertical axis 604 in relationship to time on the horizontal axis 602. The current 606 can have, a disconnected or zero amperage state 608, a first current level 610, a high current level 612, and a current limit level 614.

In at least one version, the first main FET section 616 may always be in an on state 618 or have a gate coupled to the voltage source. Similarly, the first sense FET section 626 may always be in an on state 628 or have a gate coupled to the voltage source. The second main FET section 620 may be switched in or out of a circuit depending on the current level. An off state or switched out state 622 can be illustrated by a low signal, while an on state or switch in state 624 can be indicated by a high signal. Similarly, the second sense FET section 630 may be switched in or out of a circuit depending on the current level. An off state or switched out state 632 can be illustrated by a low signal, while an on state or switch in state 634 can be indicated by a high signal.

The timing diagram also illustrates three timing sections 636, 640, and 642. These timing sections could be in different orders, have multiple iterations of the various sections, or fewer sections that those illustrated. In the timing section 636, the current 606 can be at its lowest value and/or can be disconnected. When the current may be at its lowest stage the second main FET section 620 may not be active within the circuit or may be in a switched off state or switched out of the circuit. With the current 606 at its lowest value or state both or all of the sense FET sections 626 and 630 can be active, turned on, or switched into the circuit. The lowest stage or value of the current 606 could be a disconnect, disconnected state, or a small sense current value.

Timing section 636 may illustrate the sense FET sections and main FET sections operating in a low current or DC disconnect state. During timing section 636, the current 606 could be in a DC disconnect 608 or low current state or second current stage or value 610. When the current rises above the DC disconnect or second current stage or value 610, to a high current level 612 the second main FET section 620 may switch on and second sense FET section 630 can be disconnected during or as the dual stage current sense circuit enters timing section 640.

Timing section 640 may illustrate the sense FET sections and main FET sections operating in a high current state. During timing section 640, the current 606 may be in a high current state but below the current limit level 614. During the high current state, the main FET sections 616/620 are turned on, while all of the sense FET sections 630 (and/or others not shown) but the first sense FET section 626 are turned off.

Timing section 642 may illustrate the sense FET sections and main FET sections operating in a current limit state. When the current 606 exceeds the current limit level 614, the gate voltage to main FET sections 616 and 620, as well as first sense FET section 626, is reduced until the current settles at or below the current limit level 614. After the current has settled back to the current limit level 614 the dual stage current sense circuit may enter another timing section 644, that may be any of the other time sections.

While this disclosure has been particularly shown and described with reference to preferred embodiments, it will be understood by those skilled in the art that various changes in form and detail may be made therein without departing from the spirit and scope of the present disclosure. The inventors expect skilled artisans to employ such variations as appropriate, and the inventors intend the disclosure to be practiced otherwise than as specifically described herein. Accordingly, this present disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

While various embodiments in accordance with the principles disclosed herein have been described above, it should be understood that they have been presented by way of example only, and not limitation. Thus, the breadth and scope of this disclosure should not be limited by any of the above-described exemplary embodiments, but should be defined only in accordance with any claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically, and by way of example, although the headings refer to a "Technical Field," the claims should not be limited by the language chosen under this heading to describe the so-called field. Further, a description of a technology as background information is not to be construed as an admission that certain technology is prior art to any embodiment(s) in this disclosure. Neither is the "Brief Summary" to be considered as a characterization of the embodiment(s) set forth in issued claims. Furthermore, any reference in this disclosure to "invention" in the singular should not be used to argue that there is only a single point of novelty in this disclosure. Multiple embodiments may be set forth according to the limitations of the multiple claims issuing from this disclosure, and such claims accordingly define the embodiment(s), and their equivalents, that are protected thereby. In all instances, the scope of such claims shall be considered on their own merits in light of this disclosure, but should not be constrained by the headings set forth herein.

The invention claimed is:

1. A Power over Ethernet Power Source Equipment circuit comprising:
    a first transistor having a first drain, a first gate and a first source, wherein the first drain is coupled to a port terminal, and the first source is coupled to a ground terminal;
    a second transistor having a second drain, a second gate and a second source, wherein the second drain is coupled to the port terminal, and the second source is coupled to the ground terminal;
    a third transistor having a third drain, a third gate and a third source, wherein the third gate is coupled to the first gate, and the third source is coupled to the ground terminal;
    a first switch having first, second and third switch terminals and a first switch control terminal, wherein the first switch terminal is coupled to the first gate and to the third gate, the second switch terminal is coupled to the second gate, and the third switch terminal is coupled to the ground terminal;
    a fourth transistor having a fourth drain, a fourth gate and a fourth source, wherein the fourth drain is coupled to the third drain, and the fourth source is coupled to the ground terminal;
    a second switch having fourth, fifth and sixth switch terminals and a second switch control terminal, wherein the fourth switch terminal is coupled to the first gate and to the third gate, the fifth switch terminal is coupled to the fourth gate, and the sixth switch terminal is coupled to the ground terminal;
    an amplifier having first and second amplifier inputs and an amplifier output, wherein the first amplifier input is coupled to the first and second drains, and the second amplifier input is coupled to the third and fourth drains;
    a fifth transistor having a fifth drain, a fifth gate and a fifth source, wherein the fifth gate is coupled to the amplifier output, and the fifth source is coupled to a power supply;
    a sixth transistor having a sixth drain, a sixth gate and a sixth source, wherein the sixth gate is coupled to the amplifier output, the sixth source is coupled to the power supply, and the sixth drain is coupled to the third and fourth drains; and
    a comparator having first and second comparator inputs and a comparator output, wherein the first comparator input is coupled to a threshold voltage input, the second comparator input is coupled to the fifth drain, and the comparator output is coupled to the first and second switch control terminals.

2. The circuit of claim 1, wherein the first transistor and the second transistor are sections of a main transistor, and the third transistor and the fourth transistor are sections of a sense transistor.

3. The circuit of claim 2, wherein the first transistor has Np1 fingers of width Wp1 and length Lp1, and the third transistor has Ns1 fingers of width Ws1 and length Ls1, and a ratio of a size of the first transistor to a size of the third transistor m=(Np1/Ns1)*(Wp1/Ws1)*(Ls1/Lp1).

4. The circuit of claim 3, wherein the second transistor has Np2 fingers of width Wp2 and length Lp2, and a ratio of a size of the second transistor to the size of the first transistor n=(Np2/Ns1)*(Wp2/Ws1)*(Ls1/Lp2).

5. The circuit of claim 4, wherein a ratio of the size of the first transistor to the size of the third transistor and a ratio of the size of the second transistor to the size of the third transistor each equal approximately (m+n):1.

6. The circuit of claim 5, wherein the fourth transistor has Ns2 fingers of width Ws2 and length Ls2, and a ratio k of a size of the fourth transistor to the size of the third transistor equals (Ns2/Ns1)*(Ws2/Ws1)*(Ls1/Ls2).

7. The circuit of claim 6, wherein a ratio of the size of the first transistor to the size of the third transistor, and a ratio of the size of the first transistor to the size of the fourth transistor each equals approximately m:(k+1).

8. The circuit of claim 7, wherein the ratio (m+n):1 is larger than the ratio m:(k+1).

9. The circuit of claim 7, wherein the circuit achieves a range of size ratios of (m+n)/m*(k+1).

10. The circuit of claim 1, wherein the first transistor, the second transistor, the third transistor, and the fourth transistor form part of a dual stage current sense circuit.

11. The circuit of claim 1, wherein the comparator is a first comparator and the circuit further comprising a second comparator having third and fourth comparator inputs and a second comparator output, in which the third comparator input is coupled to the fifth drain, the fourth comparator input is coupled to a current limit input, and the second comparator output is coupled to the first gate.

12. The circuit of claim 1, wherein the comparator is a first comparator and the circuit further comprising a second comparator having third and fourth comparator inputs and a second comparator output, in which the third comparator input is coupled to the fifth drain, the fourth comparator input is coupled to a current limit input, and the second comparator output is coupled to a DC disconnect output.

13. The circuit of claim 4, wherein the first transistor, the second transistor, the third transistor, and the fourth transistor form part of a dual stage current sense circuit.

14. The circuit of claim 1, wherein the threshold voltage input is configured to receive an external threshold signal.

15. The circuit of claim 1, wherein the comparator incorporates hysteresis.

* * * * *